United States Patent [19]
Abe

[11] Patent Number: 5,746,868
[45] Date of Patent: May 5, 1998

[54] METHOD OF MANUFACTURING MULTILAYER CIRCUIT SUBSTRATE

[75] Inventor: Tomoyuki Abe, Kawasaki, Japan

[73] Assignee: Fujitsu Limited, Kawasaki, Japan

[21] Appl. No.: 503,917

[22] Filed: Jul. 19, 1995

[30] Foreign Application Priority Data

Jul. 21, 1994 [JP] Japan ............. 6-169827

[51] Int. Cl.⁶ ............. B32B 31/18; B32B 31/26; H05K 3/02; B05D 5/12
[52] U.S. Cl. ............. 156/247; 156/253; 156/272.8; 29/846; 427/96; 427/123; 427/125
[58] Field of Search ............. 156/89, 247, 252, 156/277, 253, 272.8; 29/846, 847, 848, 851; 427/123, 125, 96, 97; 174/257, 262, 263; 264/61

[56] References Cited

U.S. PATENT DOCUMENTS

| | | | |
|---|---|---|---|
| 3,956,052 | 5/1976 | Koste et al. | 156/247 |
| 4,148,275 | 4/1979 | Benden et al. | |
| 4,169,001 | 9/1979 | Kaiser | 156/250 X |
| 4,218,248 | 8/1980 | Snyder et al. | |
| 4,435,342 | 3/1984 | Wentzell | |
| 4,454,167 | 6/1984 | Bernot et al. | |
| 4,619,691 | 10/1986 | Araya et al. | |
| 4,802,945 | 2/1989 | Opina | 156/252 X |
| 4,882,245 | 11/1989 | Gerlome et al. | 174/257 X |
| 4,957,061 | 9/1990 | Ando et al. | |
| 5,286,927 | 2/1994 | Ueno et al. | |
| 5,292,624 | 3/1994 | Wei | 156/89 X |
| 5,294,242 | 3/1994 | Zurecki et al. | |
| 5,531,020 | 7/1996 | Durand et al. | 264/61 X |

FOREIGN PATENT DOCUMENTS

| | | |
|---|---|---|
| 56-83844 | 7/1981 | Japan. |
| 58-122798 | 7/1983 | Japan. |
| 59-119791 | 7/1984 | Japan. |
| 1-108744 | 4/1989 | Japan. |
| 1-118450 | 5/1989 | Japan. |
| 3-156930 | 7/1991 | Japan. |
| 3-228363 | 10/1991 | Japan. |
| 4-162589 | 6/1992 | Japan. |
| 4-186731 | 7/1992 | Japan. |
| 4-186741 | 7/1992 | Japan. |
| 4-206687 | 7/1992 | Japan. |
| 4-251945 | 9/1992 | Japan. |
| 5-44045 | 2/1993 | Japan. |
| 5-47771 | 2/1993 | Japan. |
| 5-48235 | 2/1993 | Japan. |
| 5-136128 | 6/1993 | Japan. |
| 5-152744 | 6/1993 | Japan. |
| 5-152748 | 6/1993 | Japan. |
| 5-152750 | 6/1993 | Japan. |
| 5-152754 | 6/1993 | Japan. |
| 5-152755 | 6/1993 | Japan. |
| 5-152764 | 6/1993 | Japan. |
| 5-291727 | 11/1993 | Japan. |
| 5-326644 | 12/1993 | Japan. |
| 5-343595 | 12/1993 | Japan. |
| 6-93418 | 4/1994 | Japan. |
| 6-310243 | 11/1994 | Japan. |
| 93/04998 | 3/1993 | WIPO. |

*Primary Examiner*—Curtis Mayes
*Attorney, Agent, or Firm*—Armstrong, Westerman Hattori, McLeland & Naughton

[57] ABSTRACT

A method of manufacturing a multilayer circuit substrate includes a process of forming via holes in an insulating film, a process of applying an electrically conducting paste obtained by having ultra-fine metal particles disperse in a solvent onto an insulating film, and a process of forming vias composed of a sintered product of ultra-fine metal particles in the via holes by removing the solvent and also sintering the ultra-fine metal particles. The sintered products of the ultra-fine metal particles on the insulating layer is removed (or patterned) by peeling off the protective film stuck to the insulating layer.

18 Claims, 14 Drawing Sheets

METHOD OF MANUFACTURING MULTILAYER CIRCUIT SUBSTRATE

BACKGROUND OF THE INVENTION

1. Field of the Invention

The present invention relates to a method of manufacturing a multilayer circuit substrate, and more particularly to a method of manufacturing a multilayer circuit substrate having a structure that multilevel interconnections are connected with each other through vias.

2. Description of the Prior Art

As an electronic computer becomes higher in operation speed and a semiconductor device becomes larger in capacity and becomes more highly integrated, a method of packaging of a semiconductor device on a substrate has also been changed to a large extent.

In a thin film multilayer circuit substrate, high density packaging, fine interconnection, multilayer formation or the like have become the mainstream, and a plurality of interconnections (conductors) have become to be formed in a small space. Further, in order to achieve high-speed propagation of a signal, it has become indispensable to reduce parasitic capacity by using an insulating film of low dielectric constant.

A thin film multilayer circuit substrate is obtainable by repeating such a process that an interconnection is formed on the insulating film, an insulating film is formed further thereon, and an interconnection is formed on the insulating film. In this case, a conductive via is formed in an interlayer insulating film in order to connect an upper interconnection and a lower interconnection with each other electrically.

A general process of forming vias is as described hereunder. First, photosensitive resin is used as an interlayer insulating film, this photosensitive resin is applied onto a substrate, and then via holes are formed in the photosensitive resin through exposure and development, and the patterned photosensitive resin layer is cured by heating to a predetermined temperature to form an insulating layer. Then, conductive layers are formed on the cured photosensitive resin (or insulating layer) and in the via holes by sputtering, plating or the like. The conductive layers in the via holes become vias, and the conductive layers on the cured insulating layer of the photosensitive resin are formed into patterns so as to become interconnections.

A circuit substrate is formed into a multilayer by repeating such a process as formation of the interlayer insulating films and formation of via holes, vias and interconnections.

In the process of forming via holes in the photosensitive resin that becomes an interlayer insulating film after curing, however, such labor as exposure, development, and curing is required. Further, it forms the via configuration into a step shape to form the via by sputtering or plating, thus causing the via to show a thin layer partially. Such formation of the via into a thin film now incurs high resistance of the via and now causes disconnection at the connecting part between the via and the interconnection.

When photolithography is used in order to form an interconnection on the interlayer insulating film, the throughput of forming the thin film multilayer circuit substrate is decreased. Further, according to a process of photolithography, it is impossible to achieve further miniaturization of the via and formation of higher aspect ratio of the via, and to meet the requirements for high density packaging, fine interconnection, formation of a multilayer or the like attendant upon achievement of high speed of an electronic computer. As to a method of forming an interconnection, a method of having conductive ultra-fine particles project on an insulating film from a nozzle while moving the nozzle, thereby to draw interconnections composed of ultra-fine particles is described in Japanese Patent Provisional Publication No. HEI5-136128 for instance. According to this method, it is impossible to increase the moving speed of the nozzle for the purpose of eliminating configuration defects of the interconnections, and the throughput of forming the interconnections is decreased.

On the other hand, in a conventional thin film multilayer circuit substrate, such a process that an insulating film is formed, via holes are formed in the insulating film, a conductive material is filled in the via holes thereafter so as to form vias and the interconnection is further formed, is repeated a plurality of times sometimes. Since a stress is applied to an interlayer due to heating, patterning or the like performed whenever the insulating film and the conductive film are laminated repeatedly according to this process, these films become to peel off each other more easily.

Thereupon, a method of manufacturing a multilayer circuit substrate by preparing in advance a plurality of insulating films in which vias are formed and interconnections are formed on the upper surface and crimping these plurality of insulating films with heating in a state that they are placed one upon another in order to obtain good connection of multilevel interconnections is described in Japanese Patent Provisional Publication No. HEI5-152755. According to this method, however, since the vias are made to project from the insulating film, a gap becomes liable to be produced in the periphery of the vias and there is a fear that adhesion between insulating films is lowered when the number of vias is large.

SUMMARY OF THE INVENTION

It is an object of the present invention to provide a method of manufacturing a multilayer circuit substrate for improving the throughput, forming a fine via having a high aspect ratio and also making it difficult to produce exfoliation between layers.

According to the present invention, a process of forming an interconnection pattern on an insulating film and filling vias in via holes in the insulating film by using electrically conductive paste having ultra-fine metal particles is included. Ultra-fine metal particles are supplied in a uniform thickness within the via holes by using the paste in which ultra-fine metal particles are contained. Accordingly, the via formed by sintering ultra-fine metal particles shows almost uniform thickness even when the aspect ratio is made larger, thus showing good connection between the via and the interconnection.

When photosensitive resin is used for the material of the insulating layer, the via holes are formed through exposure and development. Further, when an insulating layer applicable with laser processing is used, the via holes are formed by laser abrasion. With the laser, it is possible to form a via hole having a large aspect ratio and a small diameter as compared with the case that the photosensitive resin is used.

By heating ultra-fine metal particles in vacuum for sintering, a solvent in the paste is removed and air bubbles in a sintered product of ultra-fine metal particles are also removed. The ultra-fine metal particles are burned at a lower temperature (approximately 300° C.). The throughput is improved by using the sintered product of the ultra-fine metal particles left on the insulating layer as an interconnection material as it is. The material of the ultra-fine metal particles is gold, copper, silver, palladium, nickel or the like.

Further, according to a thin film multilayer circuit substrate of the present invention, the vias composed of sintered products of ultra-fine metal particles are left in the via holes by forming a protective film on an insulating layer, forming holes for vias in the protective film and the insulating film, applying paste having ultra-fine metal particles on the protective film and in the holes hereafter, and thereafter, by removing the solvent in the paste, sintering the ultra-fine metal particles and then peeling off the protective film from the insulating layer.

With this, the process of removing the sintered product of the ultra-fine metal particles from the top of the insulating film is simplified. Besides, the protective film is formed of a material that has a high heat resisting temperature and is easily adhered and peeled off in a state of a film.

Furthermore, since opening portions are formed along the interconnection pattern in the protective film in addition to the holes for vias, the sintered product of the ultra-fine metal particles filled in the opening portions remains on the insulating film by peeling off the protective film. Since the sintered product of the ultra-fine metal particles on the insulating film is used as the interconnection, the interconnection and the via are formed at the same time, thus further improving the throughput.

According to another aspect of the present invention, a plurality of layers in which vias and interconnections are formed in or on the insulating films are formed in advance, these layers are placed one upon another so as to connect vias with interconnections, and resin (such as epoxy resin) is filled thereafter in gaps between layers (or films) by a potting method, thereby to connect between layers (or films).

It makes the stress generated between layers smaller and eliminates a gap between layers around the projections of the vias to fill the gap between layers with resin such as epoxy resin (such as epoxy resin), thus improving adhesion between layers.

In another aspect of the present invention, a first film composed of one metal or several of metals selected from groups composed of, for instance, nickel (Ni), gold (Au), palladium (Pd), and silver (Ag), etc. is formed first in an area where an electrode on a substrate surface is to be formed, and a second film composed of, for instance, copper (Cu), etc. is formed in other areas. Then, after a conductor or conductive paste film is formed by applying a conductor paste obtained by dispersing ultra-fine metal particles in a solvent onto those first and second films, heat treatment is applied so as to vaporize solvent components in the paste film and also to form a metal film composed of sintered products of the ultra-fine metal particles. According to the present invention, since ultra-fine metal particle each having a particle diameter as small as 10 nm or less for instance are used as compared with that each of the metal particles in conventional conductive paste has a diameter as large as approximately 20 μm, ultra-fine metal particles are sintered easily at a comparatively low temperature of 250° C. at the lower limit (preferably approximately 300° C.), thus making it possible to obtain a metal film.

Thereafter an adhesive tape is stuck onto the metal film, and the adhesive tape is peeled off thereafter. In this case, since the adhesion of a metal film of gold or the like to a film of nickel or the like is strong, and the adhesion of a metal film of gold or the like to a film of copper or the like is weak, the metal film on the second Cu film is removed being adhered to the adhesive tape, and only the metal film on the first Ni film remains.

In such a manner, according to the present invention, a film of gold or the like is formed on the back of the electrode by means of liftoff method. As a result, complicated process such as plating pretreatment and plating waste liquid process is unnecessary, and it is possible to form a surface electrode easily.

Further, in yet another method of manufacturing a semiconductor device of the present invention, paste obtained by dispersing ultra-fine metal particles in a solvent is used for junction between a bonding land and a semiconductor chip. Since ultra-fine metal particles are used, this paste is sintered by applying heat treatment at a comparatively low temperature of 250° C. at the lower limit (preferably approximately 300° C.), thus making it possible to bond a semiconductor chip to a bonding land firmly. With this, it is possible to fix a chip to a bonding land firmly, thus making die-bonding of excellent thermal conductivity, ohmic junction and thermal stress absorptivity possible due to the lower temperature bonding.

Besides, when an organic solvent having low viscosity such as α-terpineol is used as a solvent, the paste spreads thinly and uniformly in a gap between the chip and the bonding land by a capillary phenomenon when the chip is placed on the bonding land. With this, it is surely avoidable that the chip is inclined with respect to the substrate surface.

Further, the above ultra-fine metal particles comprise metal particles having an average particle diameter of 100 nm or less and 5 nm or more.

The sintering process is performed in the nitrogen atmosphere or the hydrogen atmosphere or the air. The palladium sintering process is not performed in the hydrogen atmosphere.

DESCRIPTION OF THE PREFERRED EMBODIMENTS (The first embodiment)

A process of manufacturing a multilayer interconnection circuit substrate according to a first embodiment of the present invention will be described with reference to FIGS. 1A to 1E.

Figure 1A:
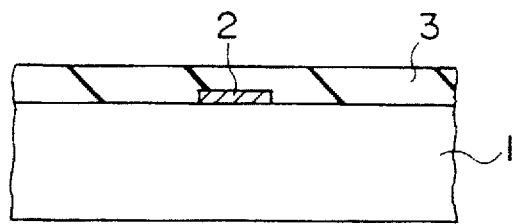
FIGS. 1A to 1E are sectional views showing a process of manufacturing a multilayer circuit substrate according to a first embodiment of the present invention.

First, as shown in FIG. 1A, an interconnection 2 in a first layer is formed on a substrate 1 composed of aluminum nitride, silicon or the like directly or through an insulating film (not shown). Thereafter, an insulating film 3 having a thickness of approximately 20 μm and a melting temperature of 300° C. or higher is formed on the substrate 1, thereby to cover the interconnection 2 in the first layer with the insulating film 3. When polyimide is used as the material of the insulating film 3, polyimide precursor solution is spin-coated on the substrate 1, which is heated and solidified so as to form the insulating film 3.

Figure 1B:
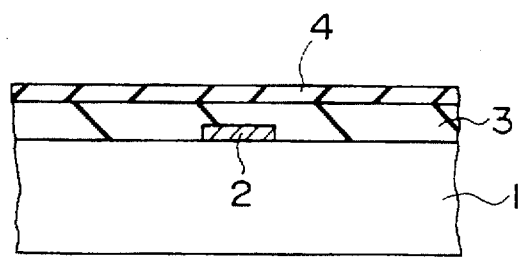

Thereafter, as shown in FIG. 1B, a protective film 4 composed of thermoplastic polyimide for instance having a thickness of approximately 20 μm is stuck on the insulating film 3. As the thermoplastic polyimide, one that has heat resistance of 300° C. or higher and is adhered or peeled off easily in a state of a film is used. As concrete materials, for example, a trade name AURUM (manufactured by Mitsui Toatsu Chemicals, Inc.), a trade name LARC-TPI (manufactured by Mitsui Toatsu Chemicals, Inc./NASA), a trade name ULTEM (manufactured by GE) and so on are available.

Figure 1C:
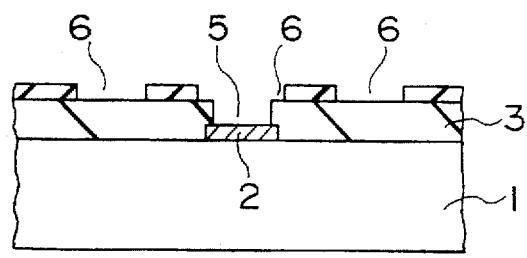

Next, as shown in FIG. 1C, the protective film 4 and the insulating film 3 located in a via forming region on the interconnection 2 in the first layer are irradiated with excimer laser, thereby to form a via hole 5 in a size of 20×20 μm$^2$ in the insulating film 3. When the excimer laser is radiated, a mask (not shown) in which a via pattern is formed is used.

Then, after irradiating energy of the excimer laser is lowered, the protective film 4 is irradiated with excimer laser along a pattern that an interconnection in the second layer is going to be formed. With this, opening portions 6 along the interconnection in the second layer is formed in the protective film 4. When the excimer laser is radiated, a mask (not shown) having an interconnection pattern is used.

Figure 1D:
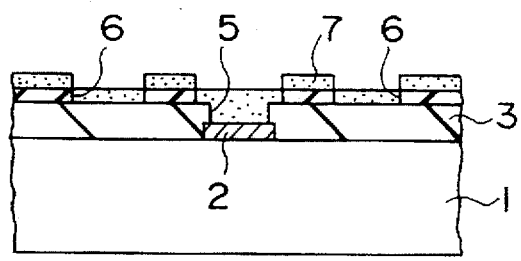

Thereafter, as shown in FIG. 1D, electrically conductive paste 7 is applied onto the protective film 4 in a thickness of 1 μm, and the paste 7 is also filled in the via hole 5 and the opening portions 6. The paste is obtained by making ultra-fine metal particles of conductors such as gold and silver palladium alloy in an organic solvent such as α-terpineol.

Then, the substrate 1 is heated at a temperature of approximately 300° C. in a low-pressure ambient atmosphere so as to vaporize the organic solvent in the paste 7, and the ultra-fine metal particles in the paste 7 are also sintered while defoaming thereby to form them into a film configuration. Since the diameter of one grain of ultra-fine metal particles is approximately 50 nm for copper and approximately 10 nm for gold, they are sintered easily by heating at approximately 300° C. Since the pattern of the opening portion 6 collapses when the protective film 4 is molten when the ultra-fine metal particles are sintered, it is required to select a material having a melting temperature higher than the sintering temperature as the material for the protective film 4. Accordingly, it is impossible to use the resist having heating resistance of approximately 150° C. only in place of the protective film 4.

Figure 1E:
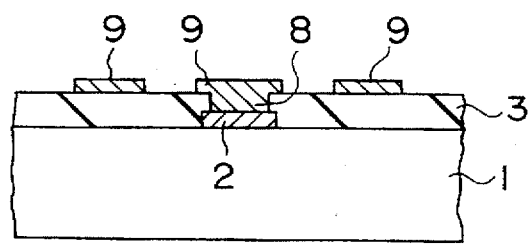

Next, when the protective film 4 is peeled off from the insulating film 3, only the pattern of ultra-fine metal particles remains on the insulating film 3 as shown in FIG. 1E. Then, a via 8 composed of the sintered product of ultra-fine metal particles is formed in the via hole 5 of the insulating film 3, and interconnections 9 in the second layer composed of the sintered product of the ultra-fine metal particles are formed further on the insulating film 3. When a resin material is used as the insulating film 3, good adhesion between the part of the insulating film 3 irradiated with laser and the sintered product of the ultra-fine metal particles is obtainable.

A multilayer interconnection circuit substrate is completed by repeating the process from which the insulating film 3 is formed until the via 8 and the interconnections 9 are formed as described above a plurality of times (5 times for instance).

Besides, as the material of ultra-fine metal particles, copper, silver, palladium, nickel and so on are available in addition to gold and silver-palladium alloy.

According to the present embodiment, the interconnection 9 is formed on the insulating film 3 or the via 8 is filled in the via hole 5 by using the paste 7 containing ultra-fine metal particles. Therefore, the via 8 that is formed by utilizing metal particles in a paste form scarcely show a step configuration even when the aspect ratio is made large, but the step is very small even though a step configuration is produced. Therefore, the via 8 is neither made to show high resistance nor disconnected, thus obtaining good connection between the via 8 and the interconnection 9.

Further, since the sintered product of ultra-fine metal particles formed on the insulating film 3 is used as the interconnection materials, it becomes unnecessary to form a new interconnection material on the insulating film 3, thus improving the throughput.

Further, useless sintered product of ultra-fine metal particles on the insulating film 3 is removed by such a simple operation that the protective film 4 is peeled off. Therefore, removal of resist and drying treatment become no longer required, and the process of filling the conductive material locally in the via hole 5 is simplified.

Furthermore, since the sintered product of the ultra-fine metal particles is made to remain along the opening portion 6 of the protective film 4, the pattern of the interconnections 9 in the second layer is formed by a simple work of peeling off the protective film 4. Therefore, resist removal and drying treatment become unnecessary, and the forming process for interconnection patterning is simplified. Moreover, since the interconnections and the vias are applied with patterning at the same time by exfoliation of the protective film 4, the throughput is further improved.

Besides, the patterning by irradiation with laser is performed in a short period of time as compared with a process of forming a conductive pattern by moving a nozzle for supplying conductive paste.

(The second embodiment)

A process of manufacturing a multilayer interconnection circuit substrate according to a second embodiment of the present invention will be described with reference to FIGS. 2A to 2E.

Figure 2A:
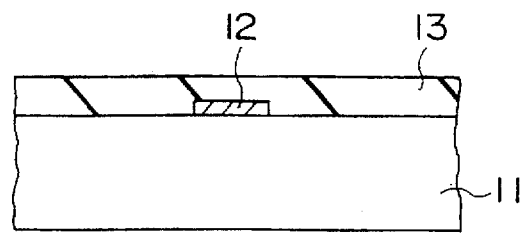
FIGS. 2A to 2E are sectional views showing a process of manufacturing a multilayer circuit substrate according to a second embodiment of the present invention.

First, as shown in FIG. 2A, an interconnection 12 in a first layer is formed on an insulating substrate 11 composed of glass or ceramics. Thereafter, an insulating film 13 having a thickness of approximately 20 μm is formed on the substrate 11, and the interconnection 12 in the first layer is covered with the insulating film 13. When polyimide is used as the insulating film 13, polyimide precursor solution is spin-coated on the substrate 11, which is solidified by heating so as to form the insulating film 13.

Figure 2B:
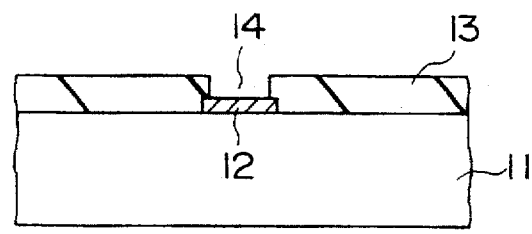

Thereafter, as shown in FIG. 2B, the insulating film 13 is irradiated with excimer laser, thereby to form a via hole 14 as large as 20×20 µm² in the irradiated region. When excimer laser is irradiated, a mask (not shown) in which a via pattern has been formed is used.

Figure 2C:
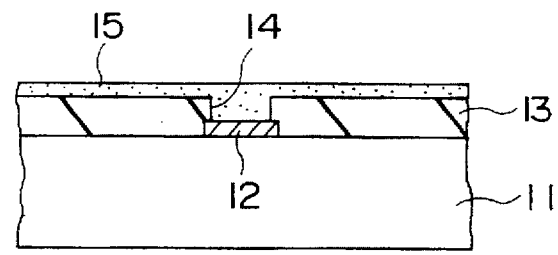

Then, as shown in FIG. 2C, paste 15 obtained by having copper ultra-fine particles dispersed in an organic solvent is applied in a thickness of 1 µm onto the insulating film 13, and the paste 15 is filled sufficiently in the via hole 14.

Figure 2D:
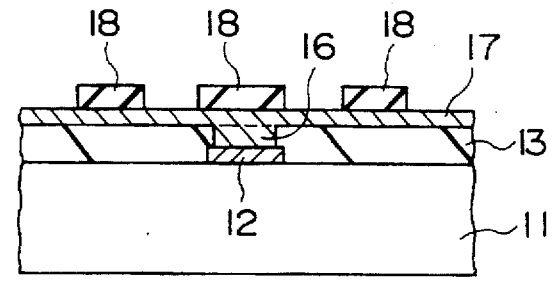
Figure 2E:
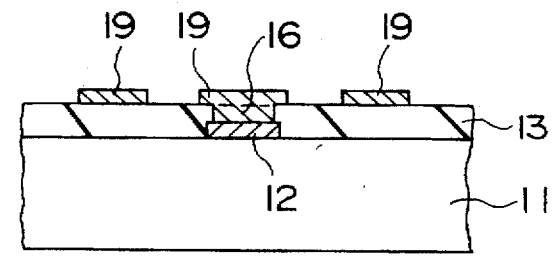

Furthermore, the organic solvent in the paste 15 is vaporized and the copper ultra-fine particles in the paste 15 are also sintered while defoaming by heating the substrate 11 at a temperature of approximately 300° C. in a low-pressure ambient atmosphere. With this, a via 16 is formed in the via hole 14 of the insulating film 13, and a conductive film 17 composed of copper is formed further on the insulating film 13. Besides, the insulating film 13 is formed of a material that is not molten (flowed or deformed) by sintering Next, as shown in FIG. 2D, resist 18 is applied onto the conductive film 17, which is exposed and developed so as to leave the resist 18 at a portion where arrangement of the interconnection in the second layer is predetermined. Then, the conductive film 17 is etched with the resist 18 as a mask, thereby to form interconnections 19 in the second layer such as shown in FIG. 2E. As an etchant of the conductive film 17 composed of copper, ammonium persulfate is used for instance.

A multilayer interconnection circuit substrate has been formed by repeating the process until the insulating film 13, the via 16 and the interconnection 19 are formed as described above five times in total for instance.

According to the present embodiment, the interconnection 19 is formed on the substrate 11 and the via 16 is formed in the via hole 14 by using the electrically conductive paste 15 having copper ultra-fine particles. Therefore, the fine via 16 is formed at a high aspect ratio similarly to the first embodiment, and moreover, the via 16 is neither made high in resistance nor disconnected, thus obtaining good connection between the via 16 and the interconnection 12, 19.

Further, since the sintered product of the ultra-fine particles that have remained on the insulating film 13 is used as the interconnection material, the process of newly forming a conductive film becomes unnecessary, thus improving the throughput.

(The third embodiment)

A process of manufacturing a multilayer interconnection circuit substrate according to a third embodiment of the present invention will be described with reference to FIGS. 3A to 3E.

Figure 3A:
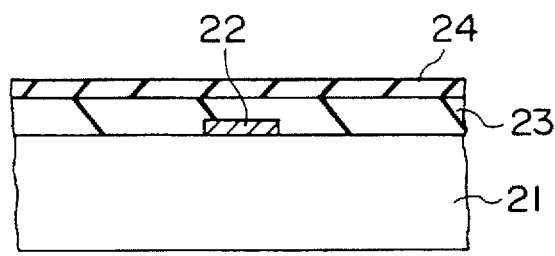
FIGS. 3A to 3E are sectional views showing a process of manufacturing a multilayer circuit substrate according to a third embodiment of the present invention.

First, as shown in FIG. 3A, an interconnection 22 in a first layer is formed on a substrate 21 composed of silicon directly or through an insulating film (not shown). Thereafter, an insulating film 23 having a thickness of approximately 20 µm is formed on the substrate 21, and the interconnection 22 in the first layer is covered with the insulating film 23. Polyimide is used for instance as the insulating film 23 similarly to the first embodiment.

Thereafter, a protective film 24 having a thickness of approximately 20 µm composed of thermoplastic polyimide for instance is stuck onto the insulating film 23.

Figure 3B:
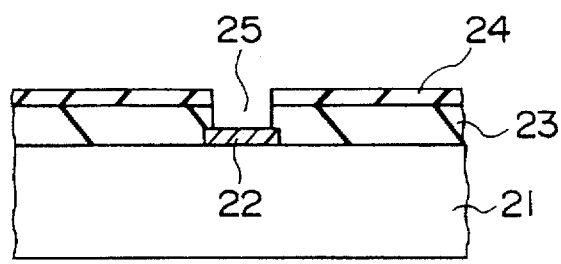

Next, as shown in FIG. 3B, the protective film 24 and the insulating film 23 located at a partial region on the interconnection 22 in the first layer are irradiated with excimer laser so as to open a hole, and a via hole 25 in the size of 20×20 µm² for instance is formed in the insulating film 23 located in the irradiated region similarly to the first embodiment.

Figure 3C:
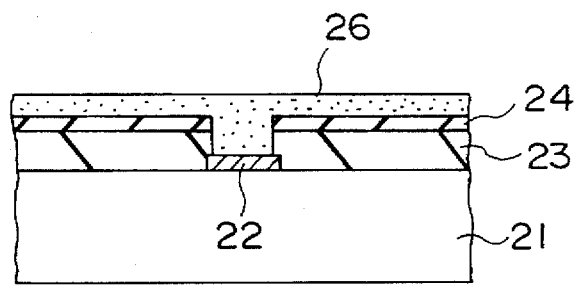

Thereafter, as shown in FIG. 3C, electrically conductive paste 26 obtained by having ultra-fine metal particles dispersed in an organic solvent is applied onto the protective film 24, and the paste is filled in the via hole 25 at the same time. Then, the organic solvent in the paste 26 is vaporized and the ultra-fine metal particles in the paste are also sintered while defoaming so as to form a conductive layer by heating the substrate at a temperature of approximately 300° C. in a low-pressure ambient atmosphere. The insulating film 23 is formed of a material that is not molten (flowed) by sintering. Further, since the protective film 24 is formed of a material having a high heat resisting temperature, it will never melt when the ultra-fine metal particles are sintered. The material for the protective film 24 that is the same as the one in the first embodiment is used.

Figure 3D:
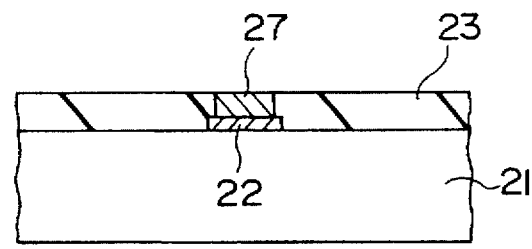

Next, when the protective film 24 is peeled off, a via 27 composed of a sintered product of the ultra-fine metal particles is formed in the via hole 25 of the insulating film 23 as shown in FIG. 3D.

Figure 3E:
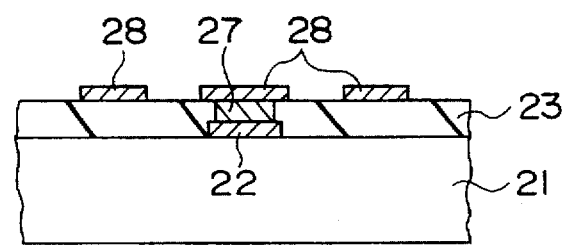

Thereafter, a conductive film such as copper is formed on the insulating film 23 and the via 27 by sputtering or the like, and then patterning is applied to the conductive film by photolithography, thereby to form interconnections 28 in the second layer such as shown in FIG. 3E.

A multilayer interconnection circuit substrate has been formed by repeating the process of forming the insulating film 23 until the via 27 and the interconnections 28 are formed as described above five times in total.

According to the present embodiment, since the via 27 is formed in the via hole 25 by using the paste 26 containing ultra-fine metal particles as described above, the via 27 formed of the sintered product of the ultra-fine metal particles scarcely shows a step configuration even when the aspect ratio is made large, and the step is very small even though a step configuration is formed. Accordingly, the via is protected from getting high in resistance and from being disconnected, thus obtaining good connection between the via 27 and the interconnection 22 or 28.

Further, since the useless sintered product of the ultra-fine metal particles on the insulating film 23 is removed by peeling off the protective film 24 without performing etching, drying or the like, the process in the case of leaving the sintered product of the ultra-fine metal particles selectively in the via hole 25 is simplified.

(The fourth embodiment)

A process of manufacturing a multilayer interconnection circuit substrate according to a fourth embodiment of the present invention will be described with reference to FIGS. 4A to 4E.

Figure 4A:
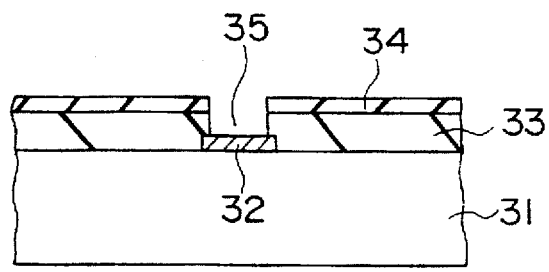
FIGS. 4A to 4E are sectional views showing a process of manufacturing a multilayer circuit substrate according to a fourth embodiment of the present invention.

First, as shown in FIG. 4A, an interconnection 32 in a first layer is formed on a substrate 31 composed of silicon directly or through an insulating film (not shown). Thereafter, an insulating film 33 having a thickness of approximately 20 µm is formed on the substrate 31, and the interconnection 32 in a first layer is covered with the insulating film 33. Polyimide is used for instance as the insulating film 33 similarly to the first embodiment.

Thereafter, a protective film 34 having a thickness of approximately 20 µm composed of thermoplastic polyimide for instance is stuck onto the insulating film 33. A material same as the one in the first embodiment is used as the material of the protective film.

Next, similarly to the first embodiment, the protective film 34 and the insulating film 33 are irradiated with excimer laser so as to open a hole at a part on the interconnection 32 in the first layer, and a via hole 35 in a size of 20×20 µm² for instance is formed in the insulating film 33 located in the irradiated region.

Figure 4B:
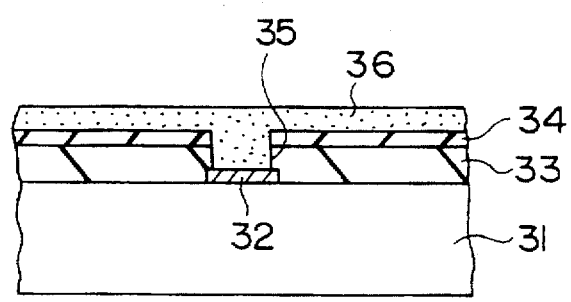

Thereafter, as shown in FIG. 4B, paste 36 obtained by having ultra-fine metal particles of conductors dispersed in an organic solvent is applied onto the protective film 34, and the paste is also filled in the via hole 35. Then, the organic solvent in the paste 36 is vaporized and the ultra-fine metal particles in the paste are also sintered while defoaming so as to form a conductive layer by heating the substrate at a temperature of approximately 300° C. in a low-pressure ambient atmosphere.

Figure 4C:
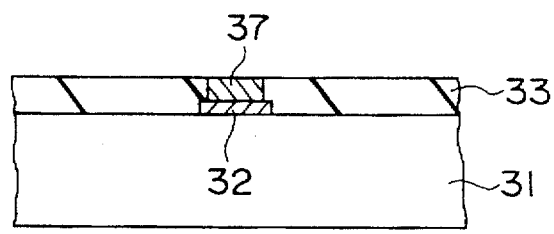

Next, when the protective film 34 is peeled off, a via 37 composed of the sintered product of ultra-fine metal particles is formed in the via hole 35 of the insulating film 33 as shown in FIG. 4C.

Figure 4D:
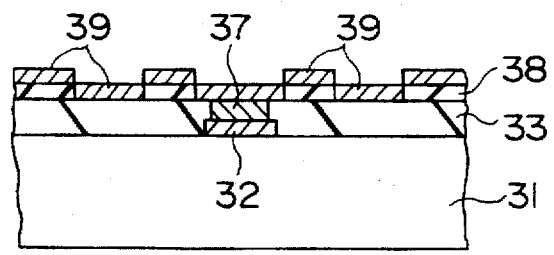

Thereafter, as shown in FIG. 4D, resist 38 is applied onto the insulating film 33 and the via 37 and exposed and developed, thereby to form opening portions in the resist 38 along a portion where arrangement of the interconnection in the second layer is predetermined. Then, a conductive film 39 such as copper is formed by sputtering or the like, the resist 38 is removed further by a solvent, and the conductive film 39 thereon is lifted off.

Figure 4E:
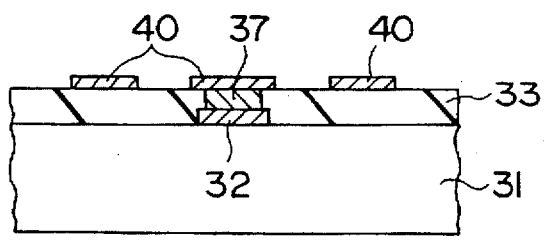

By this process, interconnections 40 in the second layer such as shown in FIG. 4E are formed on the insulating film 33.

A multilayer interconnection circuit substrate has been formed by repeating the process from the formation of the insulating film 33 until the formation of the via 37 and the interconnections 40 as described above five times in total.

According to the present embodiment, since the via 37 is formed of a sintered product of ultra-fine metal particles as described above similarly to the third embodiment, the via 37 scarcely shows a step configuration even when the aspect ratio of the via 37 is made large, and the step is very small even though a step configuration is produced. Thus, the via is prevented from getting high in resistance and from being disconnected, and good connection between the via 37 and the interconnection 40 is obtainable.

Further, when the useless sintered product of the ultra-fine metal particles on the insulating film 33 is removed, the protective film 34 is peeled off only without performing etching, drying or the like. Therefore, the process in the case of leaving the sintered product of the ultra-fine metal particles in the via hole 35 selectively is simplified.

(The fifth embodiment)

A process of manufacturing a multilayer interconnection circuit substrate according to a fifth embodiment of the present invention will be described with reference to FIGS. 5A to 5F.

Figure 5A:
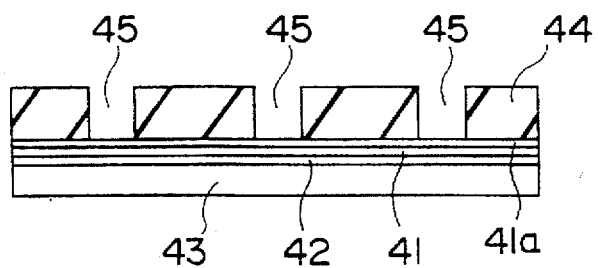
FIGS. 5A to 5F are sectional views showing a process of manufacturing a multilayer circuit substrate according to a fifth embodiment of the present invention.

First, as shown in FIG. 5A, a conductive film 42 having a three-layer structure composed of titanium (Ti), nickel (Ni) and gold (Au) is formed by sputtering on one surface of a metallic foil 41 of copper (Cu) having a film thickness of 20 μm. Ti is formed for the purpose of improving adhesion with the metallic foil 41, and Ni is used as a barrier metal. Next, after a chrome (Cr) film 41a is formed by sputtering on the metallic foil 41 on the opposite side, polyimide of low dielectric constant is applied in a thickness of approximately 20 μm, which is baked so as to form an insulating film 44 (polyimde). The Cr film 41a is formed in order to improve adhesion between the polyimide and the metallic (Cu) foil 41.

Then, after a first resist 43 is formed on the conductive film 42 having a three-layer structure (Ti/Ni/Au), a desired location of the insulating film 44 is irradiated with excimer laser thereby to form via holes 45.

Figure 5B:
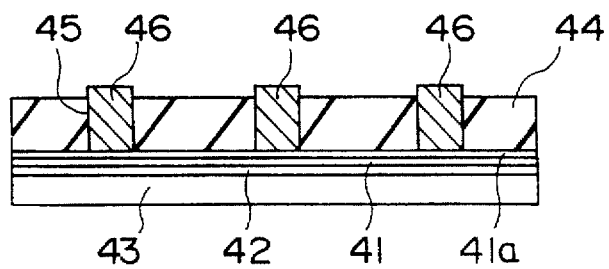

Thereafter, as shown in FIG. 5B, Sn—Pb solder plating is applied by electrolytic plating using the metallic (Cu) foil 41 as the electrode so as to fill solder sufficiently in the via holes 45, and this solder is used as vias 46. The solder is plated extending over to slight projection from the insulating film 44. Besides, since the conductive film 42 having a three-layer structure is covered by the first resist 43, no solder plating is formed on the surface thereof.

Figure 5C:
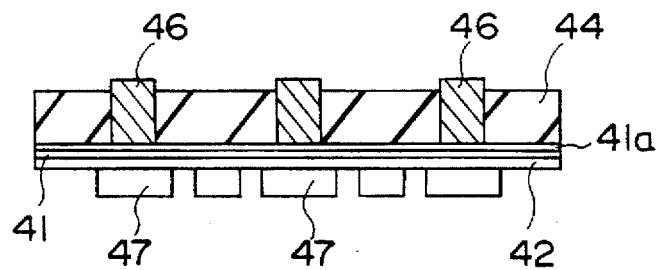
Figure 5D:
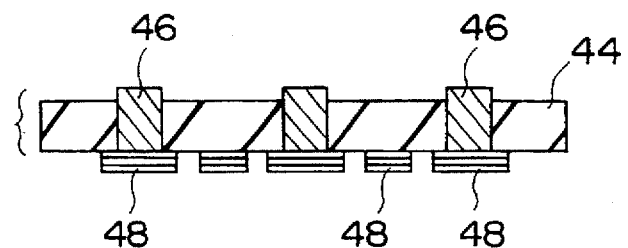

Next, as shown in FIG. 5C, after the first resist 43 is removed by oxygen plasma, a second resist 47 is applied further to the conductive film 42 having a three-layer structure, and the resist 47 is exposed and developed so as to form a pattern for interconnection. Then, the conductive film 42 having a three-layer structure (Ti/Ni/Au), the Cr layer 41a and the metallic (Cu) foil 41 are etched with the second resist 47 as a mask, thereby to form interconnections 48 composed of these metals. (See FIG. 5D.)

Figure 5E:
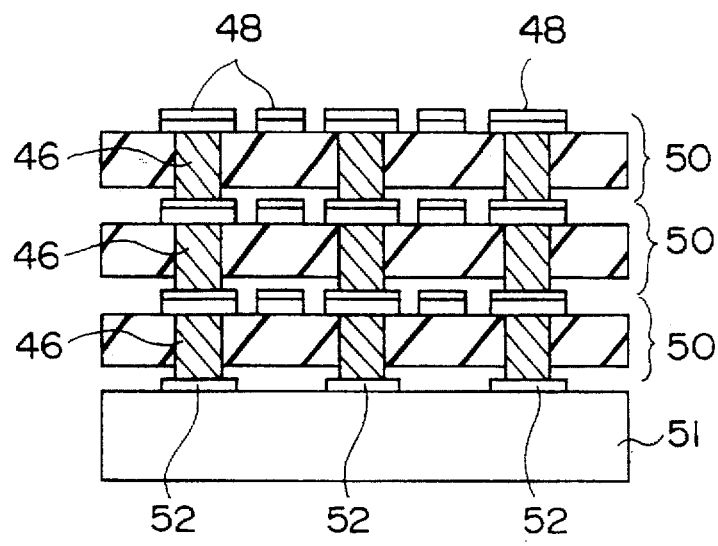

A film 50 is formed with the insulating film 44, the vias 46 and the interconnections 48 such as described above. A plurality of such films 50 are prepared and placed one upon another while performing alignment on the substrate 51 as shown in FIG. 5E. The patterns of the interconnections 48 and the positions of the vias 46 of respective layers are made all the same in FIG. 5E for convenience sake, but they may be made different with respect to each phase. Alignment is made at the same time so that the interconnections 52 formed on the substrate 51 such as aluminum nitride and the vias 46 of the films 50 lie one upon another.

Thereafter, the vias 46 and the interconnections 48, 52 or the vias placed thereon are connected mechanically and electrically by heating at a temperature at a melting point or higher of the solder material constituting the vias 46. Since solder is liable to get wet with Au of the conductive layer 42 having a three-layer structure (Ti/Ni/Au), the vias 46 are connected to the interconnections 48 and 52 easily.

The misalignment between the vias 46 and the interconnections 48 and 52 or between the via 46 and the via 46 produced in alignment between the films 50 is corrected automatically by a self-alignment effect by the surface tension of the molten solder.

Figure 5F:
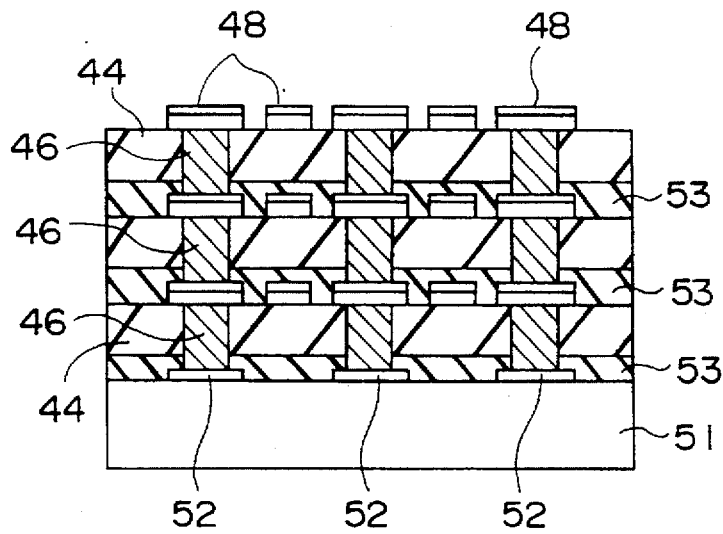

Next, as shown in FIG. 5F, the substrate 51 and the insulating films 44 connected through the interconnections 48 and 52 and the vias 46 are placed in a low-pressure ambient atmosphere, and epoxy resin 53 is filled by potting in the gap between the substrate 51 and the insulating film 44 and the gaps between the insulating films 44. With this, a multilayer thin film circuit has been obtained.

In the above-mentioned embodiment, a plurality of insulating films 44 in which the vias 46 and the interconnections 48 are formed are prepared in advance and these layers are placed one upon another so as to connect the vias 46 and the interconnections 48 and 52 with one another, and epoxy resin 53 is filled thereafter by a potting method in the gaps among the insulating films 44 and between the insulating film 44 and the substrate 51 so as to connect layers one another.

According to this method, since the stress generated between the insulating films 44 becomes smaller, and moreover, epoxy resin is also filled around the projections of the vias 46, adhesion between layers or films 50 is improved. With this, adhesion between insulating layers 44 and between the insulating film 44 and the substrate 51 is improved.

Besides, in the above description, the insulating film 44 formed on the metallic (Cu) foil 41 may be a film composed of resin having low dielectric constant such as polyimide. In this case, the insulating film 44 and the metallic (Cu) foil 41 are stuck to each other.

(The sixth embodiment)

A metallic foil is employed as a substrate, and a conductive film having a three-layer structure (Ti/Ni/Au), a Cr film, an insulating film or the like are laminated on top and bottom thereof in the fifth embodiment, but a multilayer structure may be formed with the insulating film as a substrate.

Figure 6A:
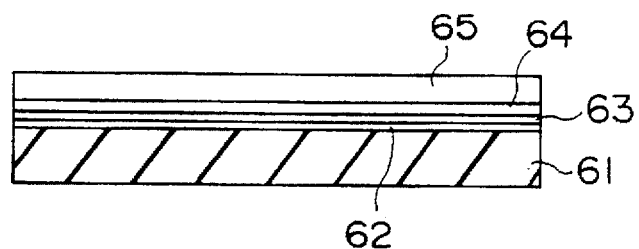
FIGS. 6A to 6C are sectional views showing a process of manufacturing a multilayer circuit substrate according to a sixth embodiment of the present invention.

For example, as shown in FIG. 6A, a Cr film 62 and a Cu film 63 are formed on a polyimide film 61 having a film thickness of 50 μm that becomes an insulating film, and a conductive film 64 having a three-layer structure of Ti, Ni and Au is formed thereafter. These metallic layers are formed by sputtering for instance. The Cr film 62 is formed for the purpose of improving adhesion between the Cu film 63 and the polyimide film 61, and in the conductive film 64 having a three-layer structure, Ti is formed for the purpose of improving adhesion between the Cu film 63 and nickel, and Ni is used as a barrier metal.

Figure 6B:
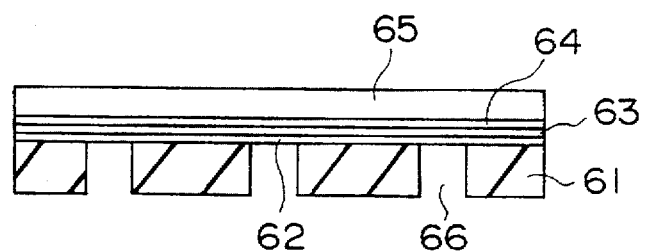

Next, after first resist 65 is formed on the conductive film 64 having a three-layer structure, via holes 66 are formed in the polyimide film 61 using excimer laser similarly to the fifth embodiment (FIG. 6B).

Figure 6C:
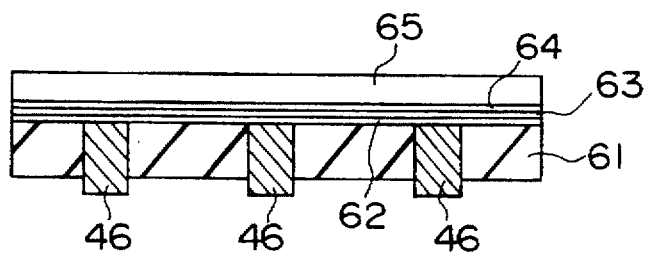

Then, as shown in FIG. 6C, vias 46 are formed in the via holes 66 with the Cr film 62, the Cu film 63 and so on the polyimide film 61 as the electrode. The vias 46 in this case are made to project slightly from the polyimide film 61.

This structure shows essentially the same structure as that shown in FIG. 5B, and thereafter, interconnections are formed along the process shown in the fifth embodiment, and the polyimide films 61 are further placed one upon another in a plurality of layers, thereby to form a multilayer circuit substrate.

Besides, the polyimide film 61 corresponds to the insulating film 44 in the fifth embodiment, and the Cu film 63 corresponds to the metallic (Cu) foil 41 in the fifth embodiment.

(The seventh embodiment)

FIGS. 7A to 7G are sectional views showing a method of manufacturing a semiconductor device according to a seventh embodiment of the present invention.

Figure 7A:
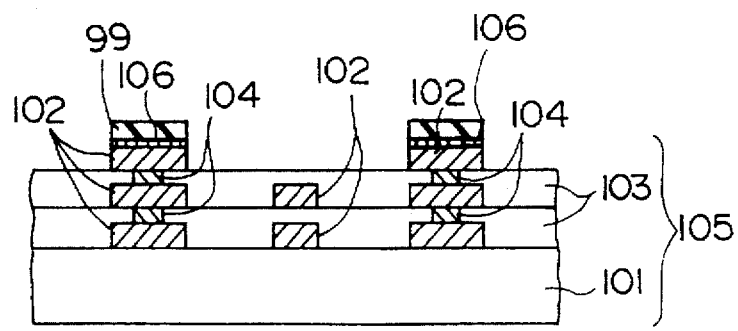
FIGS. 7A to 7G are sectional views showing a method of manufacturing a semiconductor device according to a seventh embodiment of the present invention.

First, as shown in FIG. 7A, conductor patterns (interconnections, ground or the like) 102 composed of copper and insulating films 103 composed of polyimide are formed alternately on an aluminum nitride substrate 101, thereby to form a thin film multilayer circuit substrate 105. Via holes 104 for connecting upper interconnections with lower interconnections are formed in the thin film multilayer circuit substrate 105.

This process is similar to a conventional process, and a well-known technique can be used. When the conductor patterns 102 of the uppermost layers are formed, however, the process is performed as follows. Namely, a conductor layer is formed on the whole surface of the insulating film 103, a nickel film 106 is formed in a thickness of approximately 2 μm on this conductor layer, and a patterned resist 99 is selectively formed thereafter. Then, the conductor patterns 102 of the uppermost layer are formed by etching the conductor layer with this resist as a mask.

Figure 7B:
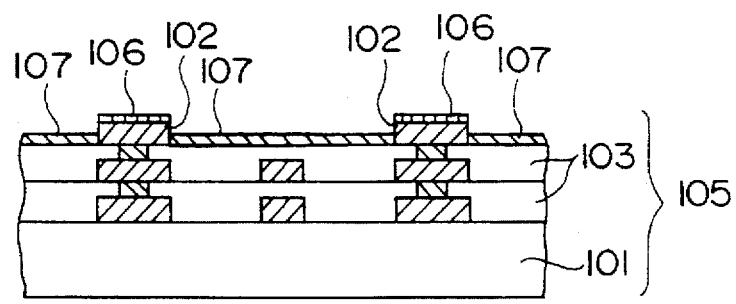

Next, after a copper film 107 is formed on the whole surface of the substrate 105 by a vacuum evaporation method or the like, the resist is peeled off. With this, as shown in FIG. 7B, it is possible to form copper films 107 only on those areas on the surface of the thin film multilayer circuit substrate 105 where no nickel film 106 has been formed. Besides, the film thickness of the copper film 107 is made to be approximately 0.5 μm.

Figure 7C:
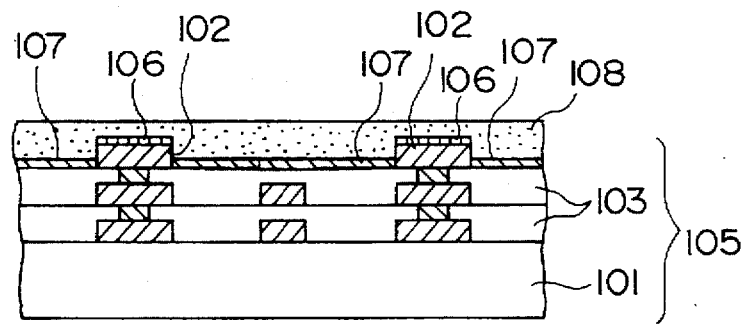

Next, as shown in FIG. 7C, paste obtained by dispersing ultra-fine gold particles each having a particle diameter of approximately 10 nm into an organic solvent is applied to the whole surface of the substrate 105 by spin coating for instance, thereby to obtain a paste film 108 having a film thickness of approximately 1 μm.

Figure 7D:
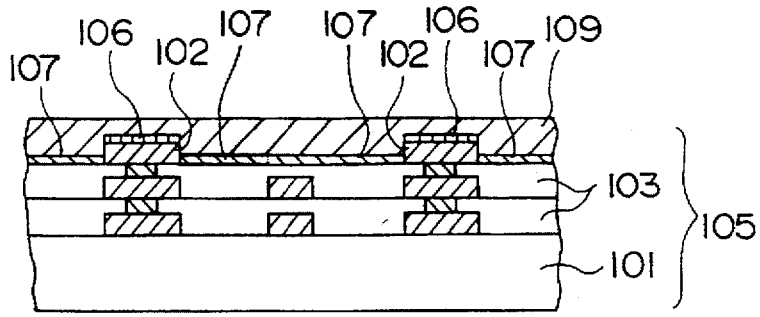

Next, as shown in FIG. 7D, heat treatment is performed at approximately 300° C. so as to vaporize the organic solvent in the paste film 108, and the ultra-fine gold particles are also sintered, thus obtaining a gold film 109. The heat treatment may also be performed in a reduced pressure atmosphere in order to prevent air bubbles from generating in the gold film 109.

Since ultra-fine gold particles each having a particle diameter as small as approximately 10 nm are used as ultra-fine metal particles, the particles are sintered easily by heating at a temperature of approximately 300° C. in the heat treatment process. Besides, ultra-fine copper particles each having a particle diameter of approximately 50 nm may also be used in place of the ultra-fine gold particles.

Figure 7E:
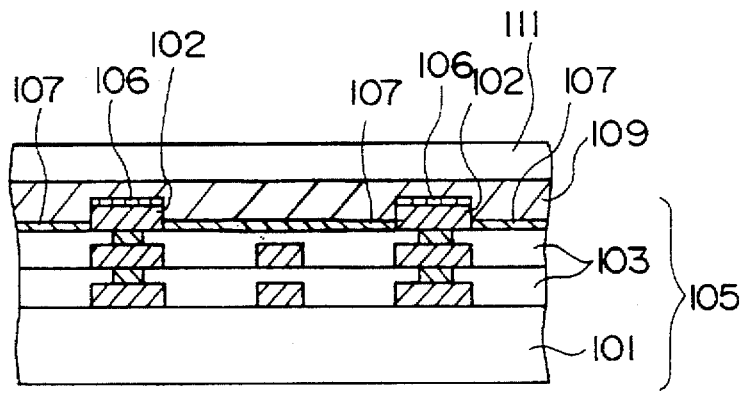
Figure 7F:
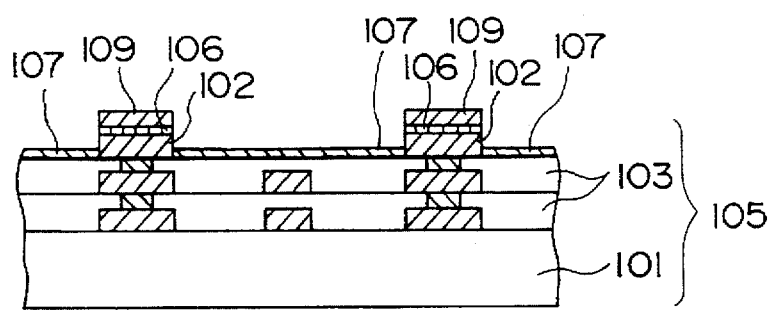

Next, as shown in FIG. 7E, after an adhesive tape 111 is stuck onto the gold film 109, the adhesive tape 111 is peeled off. Then, as shown in FIG. 7F, the gold film 109 that has adhered onto the nickel film 106 remains, but the gold film 109 that has adhered onto the copper film 107 is peeled off as it is adhered to the adhesive tape 111. This is because of such a reason that the adhesion of the gold film 109 to the copper film 107 is weak and the gold film 109 can be peeled off easy or readily with the adhesive tape 111, whereas the adhesion of the gold film 109 to the nickel film 106 is strong and the gold film 109 is not peeled off easily with the adhesive tape 111.

Figure 7G:
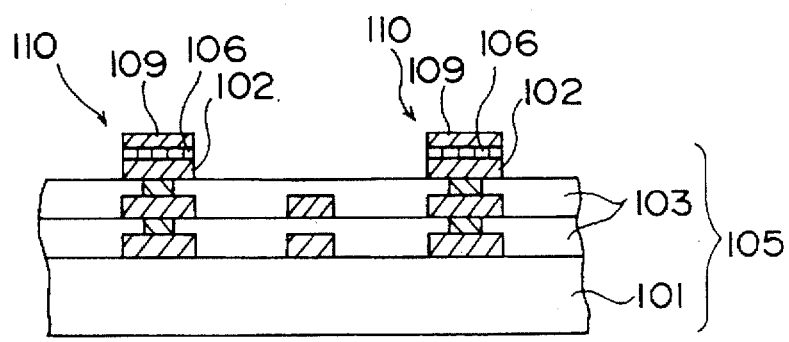

Next, as shown in FIG. 7G, the copper films 107 at the portions exposed are etched with an ammonium persulfate aqueous solution, thereby to remove the copper films 107 among the gold film 109 patterned on the surface of the substrate 105. With this, surface electrodes 110 each made of the gold film 109 on the surface thereof are completed. For example, surface electrodes 110 are used as a bonding pad.

According to the present embodiment, since it is possible to form the electrode 110 having a gold film 109 easily without plating with gold, complicated processes such as plating pretreatment and plating waste liquid treatment are not required, thus making it possible to form a surface electrode easily.

Besides, it is also conceivable that, after the gold film 109 is formed as described above, the gold film 109 is etched so as to have the gold film remain on the electrode surface only. In this case, aqua regia, cyanic etchant, iodine etchant or the like are available as the etchant for gold. In an etching method, however, the electrode is side-etched or the resist remains sometimes at dent portions in a pattern having dents unless under optimum conditions. Thus, the etching method cannot be used as to be the optimum method of forming the surface electrode. Although there is no such a drawback in a liftoff method, resist cannot bear up against heat treatment when the ultra-fine metal particles are sintered since resin resist is used in a normal liftoff method.

In the present embodiment, since a film such as gold is applied with patterning onto the electrode surface utilizing the difference between the adhesion of the nickel film 106 to the ultra-fine metal particle film (the gold film 109) and the adhesion of the copper film 107 to the ultra-fine metal particle film (the gold film 109), it is possible to form a surface electrode having a film of gold or the like on the surface locally by the liftoff method without using resin resist.

(The eighth embodiment)

FIGS. 8A to 8G are sectional views showing a method of manufacturing a semiconductor device according to an eighth embodiment of the present invention.

Figure 8A:
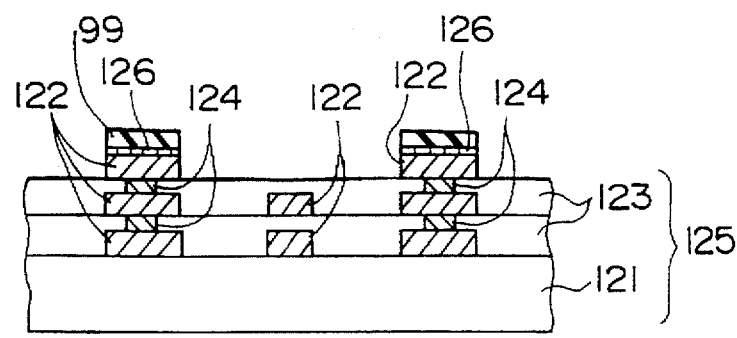
FIGS. 8A to 8G are sectional views showing a method of manufacturing a semiconductor device according to an eighth embodiment of the present invention.

First, as shown in FIG. 8A, conductor patterns 122 composed of copper and insulating films 123 composed of polyimide are formed alternately on an aluminum nitride substrate 121, thereby to form a thin film multilayer circuit substrate 125. Via holes 124 for connecting upper interconnections to lower interconnections are formed in the thin film multilayer circuit substrate 125.

This process is similar to a conventional process, and a well-known technique can be used. However, when a conductor pattern 122 in the uppermost layer is formed, the process is performed as follows. Namely, a conductor layer is formed on the whole surface of an insulating film 123, a palladium film 126 is formed on the conductor layer in a thickness of approximately 2 μm, and a pattern of resist 99 is formed thereafter. Then, the conductor pattern 122 of the uppermost layer is formed by etching the above-mentioned conductor layer with this resist as a mask.

Figure 8B:
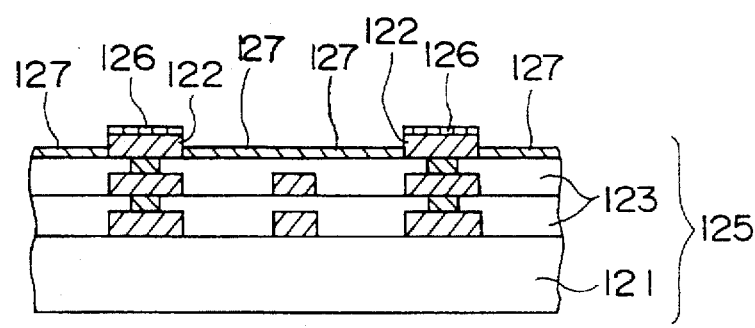

Next, after a copper film 127 is formed on the whole surface of the substrate 125 by a vacuum evaporation method or the like, the resist is peeled off. With this, as shown in FIG. 8B, it is possible to form the copper film 127 only in the areas on the surface of the thin film multilayer circuit substrate 125 where the palladium film 126 is not formed. Besides, the film thickness of the copper film 127 is made to be approximately 0.5 μm.

Figure 8C:
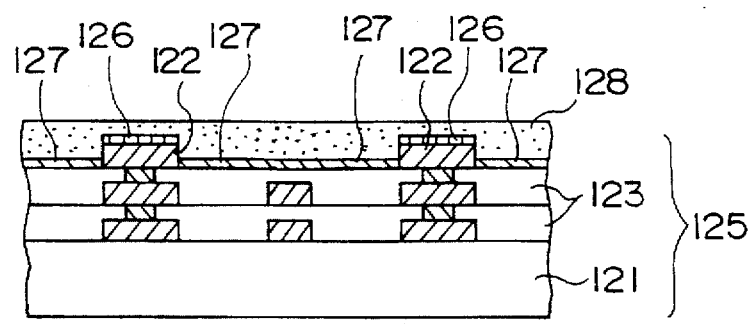

Next, as shown in FIG. 8C, a conductor paste obtained by dispersing ultra-fine metal particles of gold and palladium each having a particle diameter of approximately 10 nm is applied onto the whole surface of the substrate 125 by spin coating for instance, thereby to form a conductor paste film 128 in a thickness of approximately 1 μm.

Figure 8D:
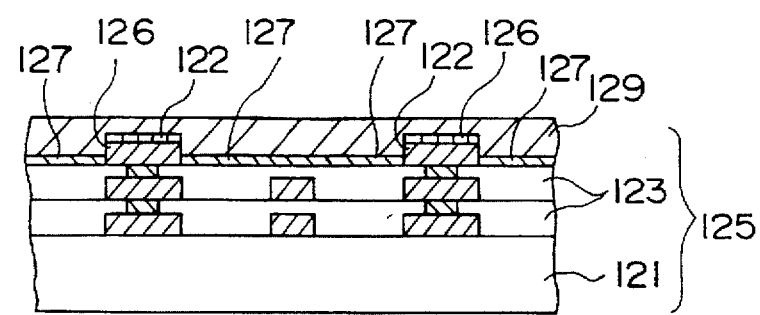

Next, as shown in FIG. 8D, the substrate 125 and the conductor paste film 128 are heat-treated at approximately 300° C. so as to vaporize an organic solvent in the conductor paste film 128 and the ultra-fine metal particles of gold and palladium particles are sintered at the same time, thereby to obtain a gold-palladium alloy film 129. This heat treatment may also be performed in a reduced pressure atmosphere in order to prevent air bubbles from generating in the gold-palladium alloy film 129. The ultra-fine metal particles of gold and palladium are sintered easily by heating at approximately 300° C.

Figure 8E:
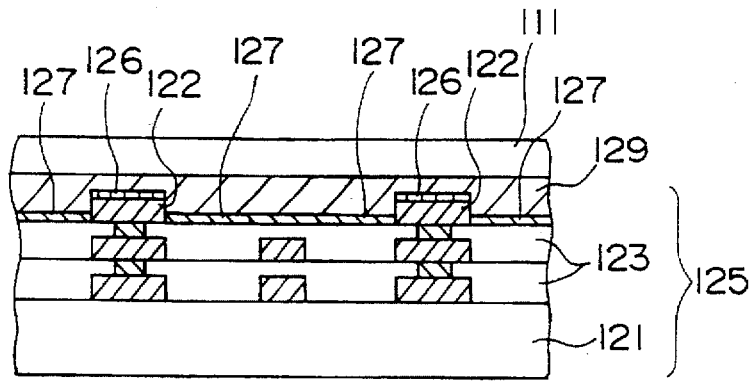
Figure 8F:
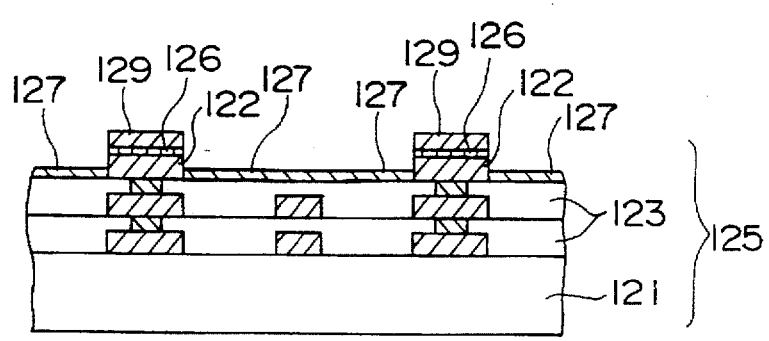

Next, as shown in FIG. 8E, after an adhesive tape 111 is stuck onto the gold-palladium alloy film 129, the adhesive tape 111 is peeled off. Then, as shown in FIG. 8F, the gold-palladium film 129 that has adhered onto the palladium film 126 remains, but the gold-palladium film 129 that has adhered onto the copper film 127 is peeled off as it is adhered to the adhesive tape 111. This is because of such a reason that the adhesion of the gold-palladium film 129 to the copper film 127 is weak and the gold-palladium film 129 can be peeled off simply with the adhesive tape 111, whereas the adhesion of the gold-palladium film 129 to the palladium film 126 is strong and the film 129 is not peeled off easily.

Figure 8G:
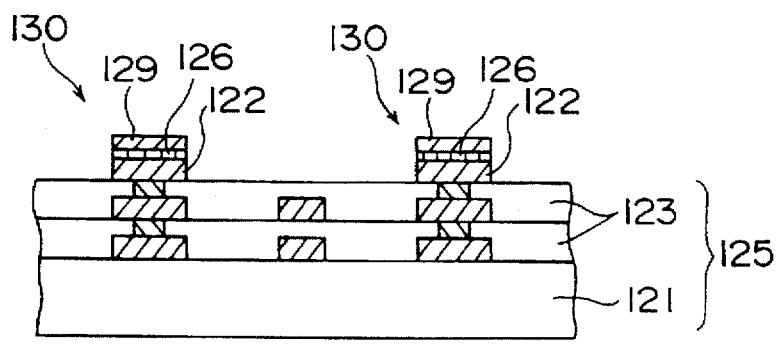

Then, as shown in FIG. 8G, the copper films 127 at the portions exposed are etched with an ammonium persulfate aqueous solution, thereby to remove the copper films 127 among conductor patterns 130 on the surface of the substrate 125. With this, surface electrodes 130 each having the gold-palladium alloy film 129 on the surface thereof are completed.

According to the present embodiment, complicated processes such as plating pretreatment and plating waste liquid treatment are not required, and it is possible to form an electrode having a gold-palladium alloy film on the surface thereof easily.

(The ninth embodiment)

FIGS. 9A to 9G are sectional views showing a method of manufacturing a semiconductor device according to a ninth embodiment of the present invention.

Figure 9A:
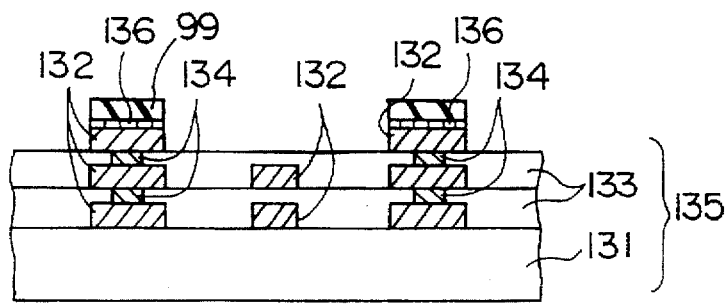
FIGS. 9A to 9G are sectional views showing a method of manufacturing a semiconductor device according to a ninth embodiment of the present invention.

First, as shown in FIG. 9A, conductor patterns 132 composed of copper and insulating films 133 composed of polyimide are formed alternately on a glass-ceramic substrate 131, thereby to form a thin film multilayer circuit substrate 135. Via holes 134 for connecting upper interconnections to lower interconnections are formed in this thin film multilayer circuit substrate 135.

This process is similar to a conventional process, and a well-known technique can be used. However, when the conductor pattern 132 of the uppermost layer is formed, the process is executed as follows. Namely, a conductor layer is formed on the whole surface of the insulating film 133, a palladium film 136 is formed on this conductor layer in a thickness of approximately 2 μm, and a pattern of resist 99 is formed thereafter. Then, a conductor pattern 132 of the upper-most layer is formed by etching the above-mentioned conductor layer with the resist as a mask.

Figure 9B:
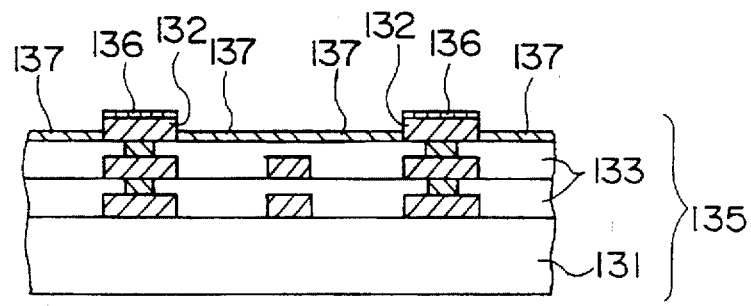

Next, after a copper film 137 is formed on the whole surface of the substrate 135 by a vacuum evaporation method or the like, the resist is peeled off. With this, as shown in FIG. 9B, it is possible to form the copper film 137 only on the areas on the surface of the thin film multilayer circuit substrate 135 where the palladium film 136 is not formed. Besides, the film thickness of the copper film 137 is made to be approximately 0.5 μm.

Figure 9C:
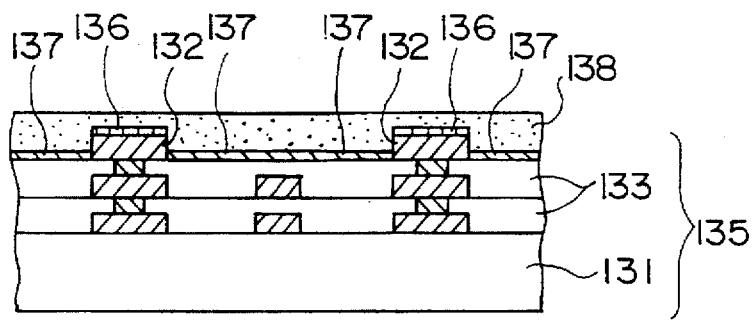

Next, as shown in FIG. 9C, paste obtained by dispersing ultra-fine gold and silver particles each having a particle diameter of approximately 10 nm into an organic solvent is applied to the whole surface of the substrate 135 by spin coating for instance, thereby to form a conductor paste film 138 in a thickness of approximately 1 μm.

Figure 9D:
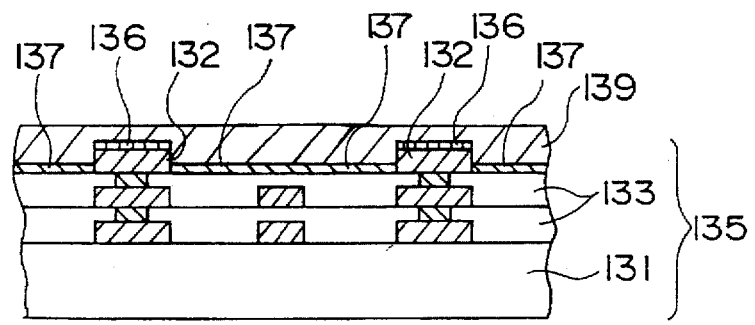

Next, as shown in FIG. 9D, the substrate 135 and the paste film 138 are heat-treated at approximately 300° C. so as to vaporize the organic solvent in the paste, and the ultra-fine gold and silver particles are sintered at the same time, thus obtaining a gold-silver alloy film 139. The heat treatment may also be executed in a reduced pressure atmosphere in order to prevent air bubbles from generating in the gold-silver alloy film 139. The ultra-fine gold and silver particles are sintered easily by heating at approximately 300° C.

Figure 9E:
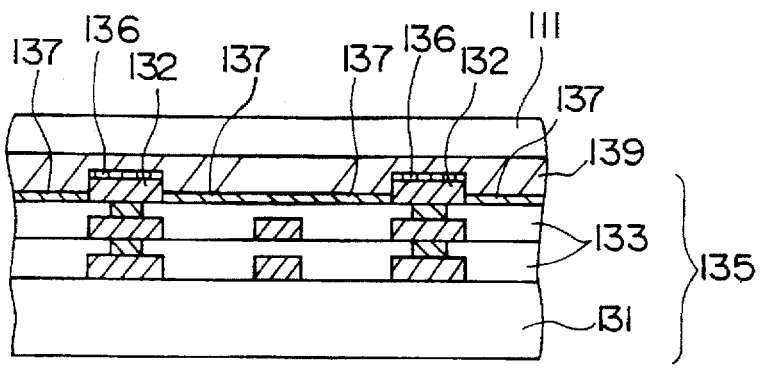
Figure 9F:
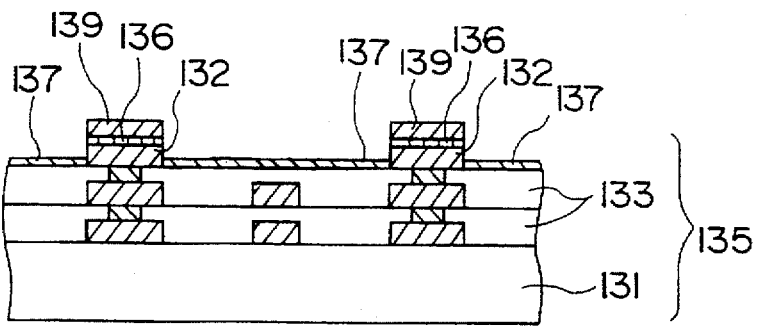

Next, as shown in FIG. 9E, after an adhesive tape 111 is stuck onto the gold-silver alloy film 139, the adhesive tape 111 is peeled off. Then, as shown in FIG. 9F, the gold-silver alloy film 139 that has adhered onto the palladium film 136 remains, but the gold-silver alloy film 139 that has adhered onto the copper film 137 is peeled off as it is stuck to the adhesive tape 111. This is because of such a reason that the adhesion of the gold-silver alloy film 139 to the copper film 137 is weak and the gold-silver alloy film 139 can be peeled off easily simply with the adhesive tape 111, whereas the adhesion of the gold-silver alloy film 139 to the palladium film 136 is strong and the film 139 is not peeled off easily with the adhesive tape 111.

Figure 9G:
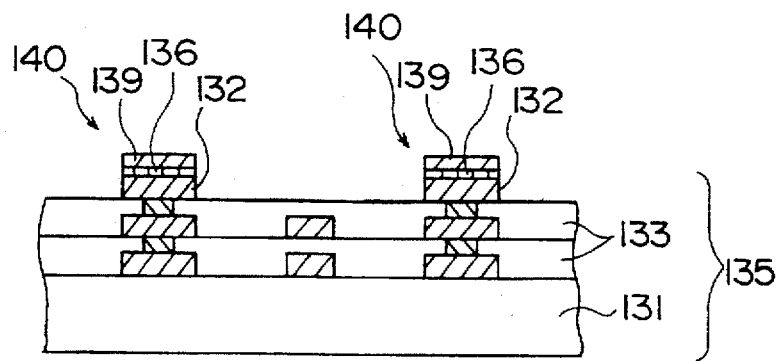

Then, as shown in FIG. 9G, the copper films 137 at the portions exposed are etched with an ammonium persulfate aqueous solution, thereby to remove the copper films 137 among conductor patterns 140 on the surface of the substrate 135. With this, a surface electrode having the gold-silver film 139 on the surface thereof is completed.

According to the present embodiment, complicated processes such as plating pretreatment and plating waste liquid treatment are not required, it is possible to form an electrode having a gold-silver film on the surface thereof easily.

(The tenth embodiment)

Figure 10A:
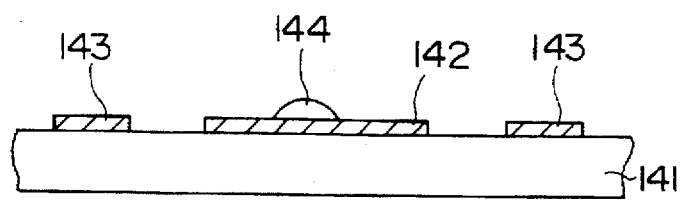
FIGS. 10A to 10C are sectional views showing a method of manufacturing a semiconductor device according to a tenth embodiment of the present invention.
Figure 10B:
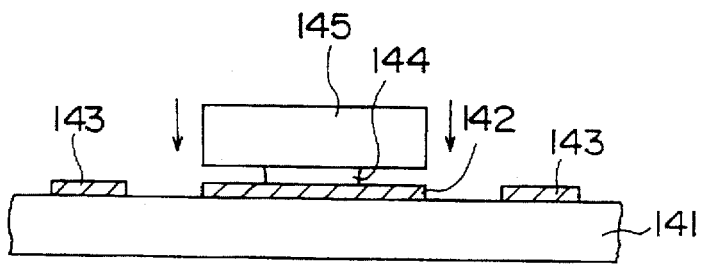
Figure 10C:
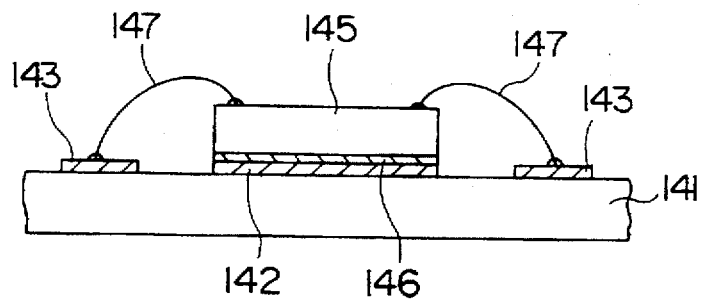

FIGS. 10A to 10C are sectional views showing a method of manufacturing a semiconductor device according to a tenth embodiment of the present invention.

First, as shown in FIG. 10A, a conductor paste 144 is dropped by an appropriate quantity with a dispenser or the like onto a bonding land 142 provided on an aluminum nitride substrate 141. This conductor paste 144 is obtained by dispersing ultra-fine metal particles of one metal or several metals such as gold, silver, palladium or copper into an organic solvent such as α-terpineol. Besides, bonding pads 143 are provided around the bonding land 142 on the surface of the substrate 141.

Next, as shown in FIG. 10B, a semiconductor chip (a bare chip) 145 is placed with alignment on the bonding land 142. At this time, the conductor paste 144 enters into a gap between the chip 145 and the bonding land 142 by a capillary phenomenon, and the conductor paste 144 spreads thinly and uniformly between them. With this, it is possible to place the chip 145 horizontally with respect to the back of the substrate 141. The chip 145 is, for example, a semiconductor chip.

Next, the chip is heated at a temperature of approximately 300° C. in a nitrogen atmosphere. With this, as shown in FIG. 10C, the organic solvent in the conductor paste 144 is vaporized, and fine metal particles are sintered at the same time, thus forming a metal film 146. The semiconductor chip 145 is fixedly attached firmly to the bonding land 142 by means of this metal film 146, and the bonding land 142 and the semiconductor chip 145 are connected electrically to each other.

Thereafter, the electrode on the chip 145 and the bonding pads 143 are connected electrically to each other by bonding wires 147 in a similar manner as before. With this, bonding or mounting of the semiconductor chip 145 on the substrate 141 is completed.

In the present embodiment, since the conductor paste 144 enters into the gap between the chip 145 and the bonding land 142 by a capillary phenomenon and spreads thinly and uniformly, the semiconductor chip 145 does not incline with respect to the surface of the substrate 141. Further, the present embodiment provides excellent adhesive property, ohmic junction property, heat conduction property and thermal stress absorption property due to lower temperature bonding, and is also applicable to a wire bonding method for thermal application. Accordingly, such effects that it is possible to aim at simplification, expedience and improvement of reliability of a die-bonding process are obtainable by the method of the present invention.

(The other embodiments)

In the above-mentioned embodiments, paste containing ultra-fine metal particles is used or solder by electrolytic plating is used as the method of filling a conductive material constituting the vias in via holes. As another filling method, a method of filling the ultra-fine metal particles in the via holes by a gas deposition method is used. The gas deposition method is a method that the ultra-fine metal particles evaporated in a space at high atmospheric pressure are transported into a region at low pressure in an aerosol state and injected from a nozzle.

As another method of forming the via holes described above, there is a method that photosensitive polyimide is used and exposed and developed (and/or cure), thereby to form the via holes. However, it is possible to make the diameter of the via hole smaller by excimer laser.

In the first to the fourth embodiments, only one via is formed in respective drawings. However, a plurality of via holes are formed practically in the multilayer circuit substrate.

What is claimed is:

1. A method of manufacturing a multilayer circuit substrate, comprising the steps of:

forming via holes in an insulating film on an under layer;

applying an electrically conductive paste obtained by having ultra-fine metal particles dispersed in a solvent onto said insulating film and into said via holes, said ultra-fine metal particles having a grain size of 5 to 50 nm; and forming vias composed of a sintered product of said ultra-fine metal particles in said via holes by removing said solvent and also sintering said ultra-fine metal particles by heating at a temperature of approximately 300° C.

2. The method of manufacturing a multilayer circuit substrate according to claim 1, wherein interconnections are formed on said insulating film by applying patterning to the sintered product of said ultra-fine metal particles that have remained on said insulating film.

3. The method of manufacturing a multilayer circuit substrate according to claim 1, wherein said metal particles are at least one of particles of gold, copper, palladium and nickel, and said solvent is α-terpineol.

4. The method of manufacturing a multilayer circuit substrate according to claim 1, wherein said sintering is performed in an ambient atmosphere at a pressure lower than the atmospheric pressure.

5. The method of manufacturing a multilayer circuit substrate according to claim 1, wherein said insulating film is formed by curing a photosensitive resin, and said via holes are formed by exposing and developing said photosensitive resin.

6. The method of manufacturing a multilayer circuit substrate according to claim 1, wherein said via holes are formed by irradiation with laser.

7. The method of manufacturing a multilayer circuit substrate according to claim 1, wherein a lower side interconnection is formed under said insulating film and under said via holes.

8. A method of manufacturing a multilayer circuit substrate, comprising the steps of:

sticking a protective film on an insulating film;

forming an opening in said protective film;

forming a via hole in said insulating film under said opening;

applying an electrically conductive paste having ultra-fine metal particles dispersed in a solvent onto said protective film and into said opening and via-hole;

heating said electrically conductive paste to remove said solvent and to make said ultra-fine metal particles into sintered product; and peeling off said protective film from said insulating film to remove said sintered product over said insulating film so that said sintered product remains in said via-hole as a via.

9. The method of manufacturing a multilayer circuit substrate according to claim 8, wherein said metal particles are at least one of particles of gold, copper, silver, palladium and nickel, and said solvent is α-terpineol.

10. The method of manufacturing a multilayer circuit substrate according to claim 8, wherein said heating is performed in an atmosphere lower than the atmospheric pressure.

11. The method of manufacturing a multilayer circuit substrate according to claim 8, wherein said heating is performed at approximately 300° C.

12. The method of manufacturing a multilayer circuit substrate according to claim 8, wherein said hole is formed by irradiation with laser.

13. The method of manufacturing a multilayer circuit substrate according to claim 8, wherein the melting temperature of said protective film is higher than the sintering temperature of said ultra-fine metal particles.

14. A method of manufacturing a multilayer circuit substrate according to claim 8, further comprising the steps of:
   forming opening portions in said protective film along an interconnection forming portion before said paste is applied;
   forming said paste on said insulating film through said opening portions;
   forming said sintered product of said ultra-fine metal particles on said insulating film by heating said paste on said insulating film at the same time when said paste is heated; and
   forming interconnections with said sintered product that has remained at traces of said opening portions by peeling off said protective film from said insulating film.

15. The method of manufacturing a multilayer circuit substrate according to claim 8, wherein said protective film is formed of thermoplastic resin.

16. The method of manufacturing a multilayer circuit substrate according to claim 15, wherein said thermoplastic resin is thermoplastic polyimide.

17. The method of manufacturing a multilayer circuit substrate according to claim 8, wherein lower interconnections are formed under said insulating film and under said via hole.

18. The method of manufacturing a multilayer circuit substrate according to claim 8, further comprising a step of forming upper interconnections passing over said via on said insulating film after peeling off the protective film.

* * * * *